United States Patent [19]
Reich et al.

[11] Patent Number: 6,011,078
[45] Date of Patent: Jan. 4, 2000

[54] AQUEOUS, RADIATION-CURABLE COATING COMPOSITIONS

[75] Inventors: Wolfgang Reich, Maxdorf; Peter Enenkel, Hessheim; Edmund Keil, Heuchelheim; Matthias Lokai, Enkenbach-Alsenborn; Erich Beck, Ladenburg; Klaus Menzel, Möglingen, all of Germany

[73] Assignee: BASF Aktiengesellschaft, Ludwigshafen, Germany

[21] Appl. No.: 09/071,155

[22] Filed: May 4, 1998

[30] Foreign Application Priority Data

May 5, 1997 [DE] Germany ............... 197 18 948

[51] Int. Cl.⁷ ............... C08F 2/46; C08F 2/48; C08F 2/50
[52] U.S. Cl. ............... 522/86; 522/84; 522/85; 522/100; 522/103; 427/508; 427/517
[58] Field of Search ............... 522/84, 86, 85, 522/100, 103, 92; 427/508, 517

[56] References Cited

U.S. PATENT DOCUMENTS

| | | | |
|---|---|---|---|
| 4,107,013 | 8/1978 | McGinnis et al. | 524/524 |
| 4,171,387 | 10/1979 | Fogle et al. | 427/54 |
| 4,269,749 | 5/1981 | Marriott et al. | 260/29.6 |
| 4,287,039 | 9/1981 | Buethe et al. | 524/524 |
| 4,451,509 | 5/1984 | Frank et al. | 427/54.1 |
| 4,528,307 | 7/1985 | Fuhr et al. | 523/440 |
| 4,636,548 | 1/1987 | Kossmann et al. | 524/524 |
| 4,719,297 | 1/1988 | Henne et al. | 544/107 |
| 4,782,109 | 11/1988 | Dulaney et al. | 524/501 |
| 5,096,938 | 3/1992 | Beck et al. | 522/100 |
| 5,362,773 | 11/1994 | Brindoepke et al. | 523/415 |
| 5,387,642 | 2/1995 | Blum et al. | 524/591 |
| 5,501,942 | 3/1996 | Salvin et al. | 430/280.1 |
| 5,548,005 | 8/1996 | Kurth et al. | 523/414 |

FOREIGN PATENT DOCUMENTS

| | | |
|---|---|---|
| 0012339 | 8/1980 | European Pat. Off. |
| 0 084 312 | 7/1983 | European Pat. Off. |
| 0279303 | 3/1992 | European Pat. Off. |
| 0 584 734 | 3/1994 | European Pat. Off. |
| 0496205 | 2/1995 | European Pat. Off. |
| 1621820 | 5/1984 | Germany . |
| 2108365 | 10/1984 | Germany . |
| 3235610 | 8/1985 | Germany . |
| 3502944 | 3/1987 | Germany . |
| 1 209 851 | 10/1970 | United Kingdom . |
| 1354436 | 5/1974 | United Kingdom . |

OTHER PUBLICATIONS

Derwent Abstracts, JP 52 033929, Mar. 15, 1977.
Derwent Abstracts, EP 0 704 469, Apr. 3, 1996.
Derwent Abstracts, EP 126 341, (DE 33 16 593, Nov. 8, 1984).
Derwent Abstracts, DE 4 114 518, Nov. 5, 1992.
Derwent Abstracts, DE 3 740 139, Jun. 8, 1989.
Derwent Abstracts, EP 0 583 728, Feb. 23, 1994.
Derwent Abstracts, JP 01 304 935, Dec. 8, 1989.
Derwent Abstracts, JP 55 039 239, Mar. 19, 1980.
Derwent Abstracts, DE 3 616 434, Nov. 19, 1987.
Derwent Abstracts, DD 252 983, Jan. 6, 1988.
Derwent Abstracts, DD 160 660, Jan. 25, 1984.
Lakokras. Mater. IKH Primer, 6, 67, pp. 64–68, 1987.
Derevoobrab. PROM. No. 7, pp. 6–7, 1979.
P. K. T. Oldring, Chem. & Technol. Of UV &EB Formulation for Coatings, Inks & Paints, SITA Technol., vol. 3, pp. i to xi, "Photoinitiators For Free Radikal & Cationic Polymerization", 1991.
H. Van Den Wiel, Ind. Vernici, vol. 35, No. 11, pp. 7–13, "Resine Acriliche Idrosolubili Nell' Industria Del Metallo E Del Legno", 1981.
Andrew Mercurio, et al., Journal of Coatings Technology, vol. 51, No. 654, pp. 45–51, "Latex–Based All–Surface Primers", Jul. 1979.

*Primary Examiner*—James J. Seidleck
*Assistant Examiner*—Sanza L. McClerdon
*Attorney, Agent, or Firm*—Oblon, Spivak, McClelland, Maier & Neustadt, P.C.

[57] ABSTRACT

Described are aqueous, radiation-curable coating compositions comprising:
a) from 5.0 to 90.0% by weight of at least one water-dispersible polymer P comprising at least one $\alpha,\beta$-ethylenically unsaturated, radiation-polymerizable double bond,
b) from 0.1 to 90% by weight of at least one radiation-curable compound S which is different from P and which is soluble in water or is dilutable with at least 10% by weight of water, based on the overall weight of the coating composition, and which comprises at least one $\alpha,\beta$-ethylenically unsaturated, radiation-polymerizable double bond,
c) from 0 to 20% by weight of a photoinitiator,
d) from 0 to 60% by weight of a filler,
e) from 0 to 20% by weight of further additives,
f) water to 100% by weight and their use.

20 Claims, No Drawings

AQUEOUS, RADIATION-CURABLE COATING COMPOSITIONS

The present invention relates to aqueous, radiation-curable coating compositions which comprise at least one water-dispersible polymer or an aqueous polymer dispersion based on such a polymer, and at least one further water-soluble or water-dilutable, radiation-curable compound which is different from the polymer.

Radiation-curable coating materials, based for example on polyester and polyether acrylates and methacrylates, have acquired great technical significance and have found broad application. Their crosslinkability makes them suitable in particular for preparing radiation-curable coating compositions, for example paint formulations that can be cured rapidly by means of UV or electron beams. They are used both to coat nonabsorbent substrates, such as glass, plastics and metals, and absorbent substrates, such as wood, paper and leather. To avoid polluting the environment by solvent emissions and to satisfy corresponding legal provisions, use is made predominantly of radiation-curable coating formulations based on aqueous polymer dispersions. Since the adhesion of waterborne coating materials to nonabsorbent substrates, owing to the polymerization shrinkage, and to various absorbent substrates as well, is usually very poor, these surfaces have to be pretreated with an appropriate primer. Because of the abovementioned environmental aspects it is preferred in this case to employ primers likewise based on water.

DE-A-41 14 518 describes primers for producing hard, resistant surfaces on wood and similar substrate materials, based on water-dilutable, melamine-formaldehyde or melamine-urea-formaldehyde condensation products that have a low formaldehyde content. These primers, and topcoats applied subsequently, are dried with heating.

DE-A-37 40 139 describes a process for priming wood to receive aqueous coating materials, which entails the use of a plasticizer-containing synthetic resin in order to obtain a strongly filling primer which becomes anchored well in the wood and provides a secure bond to the topcoat.

U.S. Pat. No. 4,782,109 describes a paint based on a solution of a two-phase resin, the internal phase comprising a pigment and a latex and the external phase an amine-soluble resin which is dissolved in water. Examples of suitable amine-soluble resins are styrene-acrylic resins, polyvinyl acetate copolymers, acrylic copolymers and styrene-butadiene copolymers. The paint formulations are suitable inter alia as primers for metals and wood.

DE-A-21 08 365 describes alkyd resin-modified dispersions which are used to prepare paints and reinforcing adhesives. They can also be used to prepare elastic coatings on various substrates such as wood, concrete and masonry. Because of the good adhesion, these dispersions are said to be suitable for preparing primers as well.

EP-A-0 496 205 describes aqueous binder combinations which consist essentially of A) an aqueous solution or dispersion of a water-dilutable organic polyol component and B) a polyisocyanate component which is present in emulsified form in component A). The polyol component consists of at least one polyester resin which contains urethane, carboxylate and hydroxyl groups. In the examples components A) having a solids content of not more than 47.6% by weight are employed. These binder combinations are suitable for preparing paints and coating compositions, for coating mineral building materials, and for varnishing and sealing wood and paper, etc.

DE-A-35 02 944 describes aqueous primers for wood coatings which contain a dispersion of a vinyl polymer and a water-soluble zinc amine complex. These primers are said to produce transparent, lightfast films and to prevent the bleeding of wood constituents and the spotting which this causes.

EP-A-0 583 728 describes water-dilutable two-component coating compositions comprising a polyisocyanate component and a polyester resin. Here, the ester-forming derivatives are selected from dicarboxylic acids, difunctional sulfo or phosphono monomers, glycols, carboxyl and/or hydroxyl-containing compounds of relatively high functionality, and monofunctional carboxylic acids. These compositions are particularly suitable for preparing primers, fillers, topcoats and single-layer coating materials.

JP-A-01304935 describes aqueous primers for flame-retarding coating materials based on a polyvinyl alcohol and/or polyacrylamide.

JP-A-55039239 describes primers for wood which consist of aliphatic diamines, glycidyl esters of unsaturated acids and a free-radical initiator.

Also known as primers for wood are primers based on aqueous dispersions, for example styrene-butadiene latices, styrene-acrylate emulsions, vinyl acetate/acrylic copolymer latices, and alkyd resin emulsions. Ind. Vernici 1981, Vol. 35, No. 11, 7–13 describes aqueous acrylate emulsions as primers.

Journal of Coatings Technology, Vol. 51, No. 654, July 1979, pp. 45–51 describes various latex primers.

The abovementioned aqueous primers are not themselves curable by radiation, and possible use as primers for radiation-curable coating materials is described in none of the publications.

DE-A-36 16 434 describes a process for priming wood in which the primer is cured by means of UV radiation. In this case a polyisocyanate in an organic solvent, for example ethyl acetate, is first applied as an adhesive base and, following the evaporation of the solvent, the UV primer—in general customary acrylate prepolymers, for example polyester acrylates, polyepoxy acrylates and polyurethane acrylates—is applied and is cured by means of UV radiation. After sanding it is possible to apply over this primer a topcoat which is customary for coating wood. This process is technically laborious owing to the need to apply the isocyanate beforehand. Moreover, the organic solvents employed are allowed to evaporate, thereby making it necessary to carry out waste air treatment, which is likewise technically laborious.

U.S. Pat. No. 4,171,387 describes a process for producing coated substrates, for example wooden substrates, in which first of all urethane binder having a solids content of from about 25 to 35% by weight is applied to the substrate and is dried, and then a UV-curable polyacrylate resin composition is applied to this binder and is cured by means of UW radiation. In this case urethane resin is applied in a mixture of organic solvents, for example consisting of methyl ethyl ketone and toluene, and is dried with heating.

DD-A-252 983 describes an insulating coat of urea-formaldehyde resins for application to woods whose constituents inhibit the curing of coating materials, for example unsaturated polyesters.

DD-A-160 660 describes primers for UV coating materials. The aim is to improve the physicomechanical properties of the end product, to enhance the stability of the primer coat and to accelerate its photochemical curing.

None of the abovementioned documents describes radiation-curable primers based on polymer dispersions for radiation-curable topcoats.

DE-A-32 35 610 describes a radiation-curable primer composition based on (meth)acryloyl-containing prepolymers and customary auxiliaries. These primers feature a content of organic and/or inorganic fibers. They are particularly suitable for the continuous coating of wood cement articles such as wood cement particle boards, for example.

DE-A-16 21 820 describes a process for priming wood and woodlike materials for paints and other topcoats, in which a photocuring synthetic resin with a content of from 10 to 60% of inorganic fillers, such as silica, for example, is used. The publication does not indicate which UV-curing synthetic resins are employed.

JP-A-52033929 describes a UV- or electron beam-curable wood primer which consists of a mixture of a polyacrylate (from methyl methacrylate, ethyl acrylate, glycidyl methacrylate and methacrylic acid), hexanediol dimethacrylate, glycidyl methacrylate and hydroxyethyl acrylate. The primer is applied to wood, coated with a topcoat comprising an unsaturated polyester, and cured with electron beams.

Lakokras. Mater. IKH. Primen (1978), (6), 67 describes a primer based on an unsaturated polyester to which a photoinitiator is added, the primer being crosslinked by means of UV radiation.

Derevoobrab. Prom-st. (1979), (7), 6 describes unsaturated polyesters as primers, which are applied to wood, cured by means of UV radiation and then overcoated with unsaturated polyesters which are likewise cured with UW light.

EP-A-0 012 339 describes radiation-curable aqueous binder dispersions comprising:

A) from 20 to 80% by weight of water,
B) from 80 to 20% by weight of at least one prepolymer which is dispersed in A) and has polymerizable C=C double bonds, and additionally
C) from 0.1 to 30% by weight, based on B), of at least one dispersing auxiliary, and
D) from 0 to 20% by weight, based on b), of at least one photoinitiator.

Suitable components B) are polyesters which comprise polymerizable C=C double bonds, for example polyester acrylates, polyethers which contain polymerizable C=C double bonds, for example polyethers having free hydroxyl groups which are fully or partly etherified with ethylenically unsaturated alcohols, esters of polyepoxides having terminal hydroxyl groups and $\alpha,\beta$-ethylenically unsaturated carboxylic acids, polyurethane (meth)acrylates and polymers with polymerizable double bonds which are obtainable by introducing $\alpha,\beta$-ethylenically unsaturated acyl radicals into acrylate copolymers. These radiation-curable aqueous binder dispersions are highly suitable for the coating of nonmetallic organic substrates, such as leather, paper or wood. Although aqueous coating compositions of high solids content are described, the solids content indicated in the examples for the aqueous binder dispersions is at most 65% by weight. There is no reference to the possibility of using the radiation-curable aqueous binder dispersions as primers for radiation-curable topcoats.

EP-A-0 704 469 describes radiation-curable aqueous polyurethane dispersions which comprise at least one copolymerizable unsaturated group and their use as coating materials for nonabsorbent substrates such as metal, plastic and glass and for porous substrates such as leather, paper and wood, for example. It is not disclosed that in addition to the polyurethanes employed there may be further radiation-curable compounds present. The content of polyurethane in the dispersions is given as from 5 to 70% by weight, although the examples only describe dispersions having a solids content of not more than 40% by weight. Furthermore, there is again no reference to the possible use of the aqueous dispersions as a primer for aqueous, radiation-curable topcoats.

It is an object of the present invention to provide aqueous, radiation-curable coating compositions as primers for radiation-curable coating materials. The purpose of these primers is to improve the adhesion of the radiation-curable coating materials both to nonabsorbent substrates, such as metals, and, in particular, to absorbent substrates, such as leather, paper, wood and wood-derived materials. These primers should also, preferably, have as high a solids content as possible in order to allow good drying following application to the substrate.

We have found that this object is achieved, surprisingly, by aqueous, radiation-curable coating compositions which comprise at least one water-dispersible polymer or an aqueous polymer dispersion based on this polymer and at least one further, water-soluble or water-dilutable, radiation-curable compound other than this polymer. Surprisingly it has also been found that these coating compositions generally make it possible, depending on their application weight and even from a solids content of at least 65% by weight, to do without the physical drying of the coating prior to radiation curing in the case of the coating of absorbent substrates. The present invention provides aqueous, radiation-curable coating compositions comprising:

a) from 5.0 to 90.0% by weight of at least one water-dispersible polymer P comprising at least one $\alpha,\beta$-ethylenically unsaturated, radiation-polymerizable double bond,
b) from 0.1 to 90% by weight of at least one radiation-curable compound S which is different from P and which is soluble in water or is dilutable with at least 10% by weight of water, based on the overall weight of the coating composition, and which comprises at least $\alpha,\beta$-ethylenically unsaturated, radiation-polymerizable double bond,
c) from 0 to 20% by weight of a photoinitiator,
d) from 0 to 60% by weight of a filler,
e) from 0 to 20% by weight of further additives,
f) water to 100% by weight.

Component a):

The novel aqueous, radiation-curable coating compositions can contain as component a) from 5.0 to 90.0% by weight, preferably from 15 to 85% by weight, and in particular from 25 to 85% by weight, of at least one water-dispersible polymer P.

Suitable water-dispersible polymers P which comprise at least one $\alpha,\beta$-ethylenically unsaturated, radiation-curable double bond are the esters of $\alpha,\beta$-ethylenically unsaturated monocarboxylic acids and also the esters of monoesters of $\alpha,\beta$-ethylenically unsaturated dicarboxylic acids with hydroxyl-containing polycondensates Pk. Suitable $\alpha,\beta$-ethylenically unsaturated monocarboxylic acids are aliphatic $C_3$–$C_6$ carboxylic acids, for example acrylic acid, methacrylic acid, crotonic acid, and mixtures thereof. A suitable aromatic $\alpha,\beta$-unsaturated carboxylic acid is cinnamic acid. Suitable monoesters of $\alpha,\beta$-ethylenically unsaturated dicarboxylic acids are, for example, the monoesters of maleic, fumaric and itaconic acid with $C_1$–$C_{20}$, preferably $C_1$–$C_8$ monoalcohols, for example methanol, ethanol, n-propanol, isopropanol, n-butanol, isobutanol, t-butanol, 2-ethylhexanol etc.

Suitable polycondensates Pk which contain at least two free hydroxyls per molecule are, for example, the customary polyesters with or without ether groups and the customary polyethers with or without ester groups. Suitable hydroxyl-containing polyesters can be prepared, for example, in a customary manner by esterifying dibasic or polybasic carboxylic acids with dihydric or polyhydric alcohols. Processes for preparing polyesters are known to the skilled worker. In general, the carboxylic acid component employed for the esterification to prepare hydroxyl-containing polyesters comprises dibasic to tetrabasic, aliphatic and/or aromatic $C_3$- to $C_{36}$ carboxylic acids, their esters and anhydrides. Examples include succinic acid, succinic anhydride, glutaric acid, glutaric anhydride, adipic, pimelic, suberic, azelaic and sebacic acid, phthalic acid, phthalic anhydride, isophthalic and terephthalic acid, maleic acid, maleic anhydride, fumaric and citraconic acid, tetrahydrophthalic acid, tetrahydrophthalic anhydride, trimellitic acid, trimellitic anhydride, pyromellitic acid and pyromellitic anhydride. Dihydric or polyhydric alcohols suitable as starting materials for preparing polyesters are, for example, dihydric to hexahydric alcohols, for example diols such as ethylene glycol, propylene glycol, 1,4-butanediol, 1,5-pentanediol, neopentyl glycol, 1,6-hexanediol, 2-methyl-1,5-pentanediol, 2-ethyl-1,4-butanediol, dimethylolcyclohexane, triols such as glycol, trimethylolethane, trimethylolpropane, trimethylolbutane, tetraols such as pentaerythritol and ditrimethylolpropane, and hexols, such as erythritol and sorbitol. Further suitable polyesterols are polycaprolactonediols and -triols.

Other suitable hydroxyl-containing polycondensates Pk are the alkoxylates of the abovementioned dihydric or polyhydric alcohols. They include, for example, ethoxylated, propoxylated and mixed ethoxylated and propoxylated dihydric to hexahydric alcohols and polyesterols. The degree of alkoxylation is generally from 1 to 300, preferably from 2 to 150.

Further suitable polycondensates Pk are polyalkylene glycols and the polyaddition polymers of cyclic ethers, such as polytetrahydrofuran. Examples of polyalkylene glycols are polyethylene glycol, polypropylene glycol and polyepichlorohydrins.

Still further suitable polycondensates Pk are copolymers comprising in copolymerized form at least one of the abovementioned monomeric, oligomeric or polymeric components. Examples include polyesters of the abovementioned dibasic or polybasic carboxylic acids and alcohols with terminal carboxyls or hydroxyls, and polyetherols, such as the abovementioned alkoxylates, polyalkylene glycols and polymers of cyclic ethers.

To prepare the polymers P employed in accordance with the invention as component a) the abovementioned $\alpha,\beta$-ethylenically unsaturated monocarboxylic acids and dicarboxylic monoesters can be esterified with the abovementioned polycondensates Pk by customary methods. In this case the removal of the water of reaction which is formed in the course of the esterification reaction can be effected, for example, by means of water-removing agents, by extraction or by azeotropic distillation. Esterification is generally carried out in the presence of a catalyst, for example a strong acid such as sulfuric acid, anhydrous hydrogen chloride, sulfonic acids, for example toluene sulfonic acids, and acidic ion exchangers. To avoid premature polymerization the esterification takes place preferably in the presence of a polymerization inhibitor which is suitable for preventing thermal polymerization of the polymers P employed in accordance with the invention.

Further suitable components a) are the ethers of $\alpha,\beta$-ethylenically unsaturated alcohols with the abovementioned polycondensates Pk. As $\alpha,\beta$-ethylenically unsaturated alcohol component these contain, for example, allyl, methallyl, crotyl and cinnamyl alcohol and mixtures thereof. The etherification to prepare polymers P suitable as component a) is carried out by customary methods known to the skilled worker.

Further suitable components a) are epoxy resin derivatives containing $\alpha,\beta$-ethylenic double bonds. Epoxy resin derivatives which are suitable as polymers P are the reaction products of the abovementioned $\alpha,\beta$-ethylenically unsaturated monocarboxylic acids and dicarboxylic monoesters with oligomeric or polymeric components containing on average at least two epoxide groups per molecule. These include, for example, the polyglycidyl ethers of the abovementioned polyhydric alcohols, polyglycidyl ethers of condensed phenols, for example bisphenol A, glycidyl esters of the abovementioned polybasic carboxylic acids, other glycidyl compounds, for example triglycidyl isocyanurate, and epoxidized natural or synthetic oils, and mixtures thereof. Methods of reacting carboxylic acids with epoxides are known to the skilled worker.

Further suitable components a) are polyurethane derivatives which contain $\alpha,\beta$-ethylenically unsaturated double bonds. These are obtainable, for example, by reacting isocyanate-terminated polyurethanes with hydroxyl-containing esters of the abovementioned $\alpha,\beta$-ethylenically unsaturated monocarboxylic acids, such as (meth)acrylic esters, for example hydroxyethyl (meth)acrylate, hydroxypropyl (meth)acrylate, butanediol mono(meth)acrylate, etc. Isocyanate-terminated polyurethanes are obtained by reacting aliphatic and/or aromatic di- and polyisocyanates and their dimers or trimers with compounds containing active hydrogens, examples being the abovementioned polyhydric alcohols, polyfunctional amines and/or amino alcohols. When amines and/or amino alcohols are employed the result is polyurethanes which comprise urea groups. The proportion of isocyanate-terminated polyurethanes to polyurethanes with other terminal groups is controlled by way of the molar ratio of the precursors.

Water-dispersible, radiation-curable polyurethanes and dispersions thereof which are particularly suitable for the novel process are described in EP-A-0 704 469, the full content of which is hereby incorporated. This document describes a water-dispersible, radiation-curable polyurethane essentially synthesized from (1) organic polyisocyanates,
(2) polyesterpolyols
(3) if desired, polyols which are different from (2)
(4) compounds having at least one isocyanate-reactive group and at least one carboxyl or carboxylate group,
(5) compounds having at least one isocyanate-reactive group and at least one copolymerizable unsaturated group,
(6) if desired, compounds different from (1) to (5) which have at least one isocyanate reactive group.

Suitable polyisocyanates (1) are, for example, straight-chain or branched $C_4$–$C_{14}$-alkylene diisocyanates, cycloaliphatic diisocyanates having a total of 6 to 12 carbons, aromatic diisocyanates having a total of 8 to 14 carbons, polyisocyanates containing isocyanurate groups, uretdione diisocyanates, polyisocyanates containing biuret groups, polyisocyanates containing urethane and/or allophanate groups, polyisocyanates containing oxadiazinetrione groups, uretonimine-modified polyisocyanates, or mixtures thereof.

Examples of diisocyanates that may be mentioned are tetramethylene diisocyanate, hexamethylene diisocyanate (1,6-diisocyanatohexane), octamethylene diisocyanate, decamethylene diisocyanate, dodecamethylene diisocyanate, tetradecamethylene diisocyanate, trimethylhexane diisocyanate or tetramethylhexane diisocyanate, cycloaliphatic diisocyanates such as 1,4-, 1,3- or 1,2-diisocyanatocyclohexane, 4,4'-di(isocyanatocyclohexyl) methane, 1-isocyanato-3,3,5-trimethyl-5-(isocyanatomethyl)cyclohexane (isophorone diisocyanate) or 2,4- or 2,6-diisocyanato-1-methylcyclohexane, or aromatic diisocyanates such as 2,4-diisocyanatotoluene, 2,6-diisocyanatotoluene, tetramethylxylylene diisocyanate, 1,4-diisocyanatobenzene, 4,4'- and 2,4-diisocyanatodiphenylmethane, p-xylylene diisocyanate, and isopropenyldimethyltolylene diisocyanate.

The polyisocyanates containing isocyanurate groups are, in particular, simple tris-isocyanato isocyanurates, which are cyclic trimers of the diisocyanates, or mixtures with their higher homologs containing more than one isocyanurate ring.

The uretdione diisocyanates are preferably cyclic dimerization products of diisocyanates. The uretdione diisocyanates can be employed, for example, as sole component or in a mixture with other polyisocyanates, especially the polyisocyanates containing isocyanurate groups. Suitable polyisocyanates containing biuret groups preferably have an NCO content of from 18 to 22% by weight and a mean NCO functionality of from 3 to 4.5.

Polyisocyanates containing urethane and/or allophanate groups can be obtained, for example, by reacting excess amounts of diisocyanates with simple, polyhydric alcohols, for example trimethylolpropane, glycerol, 1,2-dihydroxypropane or mixtures thereof. These polyisocyanates containing urethane and/or allophanate groups generally have an NCO content of from 12 to 20% by weight and a mean NCO functionality of from 2.5 to 3.

Polyisocyanates containing oxadiazinetrione groups can be prepared from diisocyanate and carbon dioxide.

The polyesterpolyols (2) are, in particular, polyesterdiols. Suitable polyesterpolyols are those mentioned above as component Pk.

The other polyols (3) are, for example, low molecular mass diols or triols, in particular with a molecular weight of below 500 g/mol, which are used as chain extenders or crosslinkers.

As the further structural component (4) use is made of compounds which contain at least one, preferably one or two, isocyanate-reactive groups, that is hydroxyls or primary or secondary aminos, and at least one carboxyl or carboxylate group.

Mention may be made, for example, of hydroxy carboxylic acids, for example dihydroxy carboxylic acids such as dimethylolpropionic acid, sulfo-containing carboxylic acids, for example 5-sulfoisophthalic acid, or amino carboxylic acids. The latter are preferred, with particular preference being given to diamino carboxylic acids. Very particular preference is given to adducts of acrylic acid with $C_2$–$C_6$-, preferably $C_2$-alkylenediamines in a molar ratio of alkylenediamine to acrylic acid of preferably around 1:1 (PUD salt).

As a result of the structural component (4) the polyurethanes are self-dispersible; in other words, when dispersed in water they in this case generally require no dispersing auxiliaries such as protective colloids or emulsifiers.

Prior to or in the course of dispersion in water, carboxyls are neutralized by means, for example, of inorganic and/or organic bases, such as alkali metal hydroxides, carbonates, hydrogen carbonates, ammonia or primary, secondary or preferably tertiary amines such as triethylamine.

As structural component (5), having at least one copolymerizable unsaturated group and at least one reactive group, preferably an isocyanate-reactive group, suitable examples are esters of acrylic or methacrylic acid with polyols, with at least one hydroxyl remaining unesterified. Particular preference is given to $C_1$–$C_{12}$-hydroxyalkyl (meth)acrylates in which the alkyl chains can be linear or branched.

The structural components (6) which are to be employed if desired are, for example, at least difunctional amine chain extenders or crosslinkers, preferably from the molecular weight range from 32 to 500 g/mol, which contain at least two primary, two secondary or one primary and one secondary amino group.

Examples of such compounds are diamines, such as diaminoethane, diaminopropanes, diaminobutanes, diaminohexanes, piperazine, 2,5-dimethylpiperazine, amino-3-aminomethyl-3,5,5-trimethylcyclohexane (isophoronediamine, IPDA), 4,4,-diaminodicyclohexylmethane, 1,4-diaminocyclohexane, aminoethylethanolamine, hydrazine, hydrazine hydrate or triamines, such as diethylenetriamine or 1,8-diamino-4-aminoethyloctane.

Further suitable components a) are polymers P, containing $\alpha,\beta$-ethylenic double bonds, comprising polymers which contain free hydroxyls, carboxyls and/or epoxy groups that can be reacted with compounds having $\alpha,\beta$-ethylenically unsaturated double bonds, such as, for example, the abovementioned $\alpha,\beta$-ethylenically unsaturated monocarboxylic acids. This gives polymers having $\alpha,\beta$-ethylenically unsaturated acyl residues.

Particularly preferred components a) are described in EP-A-0 012 339, which is hereby incorporated fully.

The polymer P can be added as a powder or as a dispersion Pd.

Suitable polymer dispersions Pd are both primary dispersions, where the monomers are polymerized directly in the liquid phase (suspension or emulsion polymerization), and secondary dispersions, where prefabricated polymers are dispersed in an additional step.

To prepare secondary dispersions Pd of the polymers P that are employed in accordance with the invention these polymers, as solids or solutions in an inert organic solvent, can be mixed with the aqueous phase. The polymer P is preferably employed as a solution in an inert organic solvent or solvent mixture. In this case it is also possible to employ a solution obtained directly in the synthesis of the polymers P. Examples of suitable organic solvents are tetrahydrofuran, dioxane, acetone, methyl ethyl ketone, alcohols, such as n-propanol, isopropanol, n-butanol and isobutanol, esters, such as ethyl acetate and butyl acetate, and aromatic hydrocarbons, such as toluene and xylenes; preference is given to inert, water-miscible solvents, such as acetone, tetrahydrofuran, methyl ethyl ketone and alcohols.

To prepare the dispersions Pd the polymer P or its solution is mixed with an appropriate amount, for example one which corresponds to the desired solids content of the dispersion, of water, with or without at least one dispersant and with or without further additives. Suitable apparatus for mixing and, if desired, for removing the organic solvent by distillation is known to the skilled worker.

The addition of at least one dispersing auxiliary to the polymer dispersions Pd is dependent on the polymers P that are employed. EP-A-0 704 469 discloses water-dispersible, radiation-curable polyurethanes which comprise a structural component which renders them self-dispersible. If these polyurethanes are employed, therefore, it is possible to do without dispersing auxiliaries such as protective colloids or emulsifiers.

When polymers P other than the abovementioned polyurethanes are used, emulsifiers and/or protective colloids can be added to the aqueous polymer dispersions Pd in an amount of in general from about 0.05 to 20% by weight, preferably from 0.1 to 15% by weight, based on the amount of the polymer P.

Suitable emulsifiers are those commonly employed as dispersants in the context of aqueous emulsion polymerization and known to the skilled worker, as are described, for example, in Houben-Weyl, Methoden der organischen Chemie, Volume XIV/1, Makromolekulare Stoffe, Georg-Thieme-verlag, Stuttgart, 1961, pp. 411–420. Anionic, cationic and nonionic emulsifiers are suitable. It is preferred to employ emulsifiers whose relative molecular weights, unlike protective colloids, are usually below 3500 daltons.

Nonionic emulsifiers which can be used are araliphatic or aliphatic nonionic emulsifiers, for example ethoxylated mono-, di- and trialkylphenols (EO units: 3 to 50, alkyl: $C_4$–$C_{10}$), ethoxylates of long-chain alcohols (EO units: 3 to 50, alkyl: $C_8$–$C_{36}$) and polyethylene oxide/polypropylene oxide block copolymers. Preference is given to ethoxylates of long-chain alkanols (alkyl $C_{10}$–$C_{22}$, mean degree of ethoxylation from 10 to 50), and among these particular preference to those having a linear $C_{12}$–$C_{18}$-alkyl radical and a mean degree of ethoxylation of from 10 to 50, and also ethoxylated monoalkylphenols.

Examples of suitable anionic emulsifiers are alkali metal salts and ammonium salts of alkyl sulfates (alkyl: $C_8$–$C_{22}$), of sulfuric monoesters of ethoxylated alkanols (EO units: 2 to 50, alkyl: $C_{12}$–$C_{18}$) and ethoxylated alkyl phenols (EO units: 3 to 50, alkyl: $C_4$–$C_9$), of alkyl sulfonic acids (alkyl: $C_{12}$–$C_{18}$) and of alkylarylsulfonic acids (alkyl: $C_9$–$C_{18}$). Other suitable emulsifiers are given in Houben-Weyl [op. cit.] pp. 192 to 208. Other suitable anionic emulsifiers are bis(phenylsulfonic acid) ethers and their alkali metal or ammonium salts which carry $C_{4-C_{24}}$-alkyl on one or both aromatic rings. These compounds are generally known, for example from U.S. Pat. No. 4,269,749, and obtainable commercially, for example as Dowfax® 2A1 (Dow Chemical Company).

Suitable cationic emulsifiers are preferably quaternary ammonium halides, for example trimethylcetylammonium chloride, methyltrioctylammonium chloride, benzyltriethylammonium chloride or quaternary compounds of $N$-$C_6$–$C_{20}$-alkylpyridines, -morpholines or -imidazoles, for example N-laurylpyridinium chloride.

Examples of suitable protective colloids are polyvinyl alcohols and partially hydrolyzed polyvinyl acetates, polyvinylpropionates, polyacrylates, polyvinylpyrrolidone, copolymers of two or more constituent monomers of the abovementioned polymers, cellulose and cellulose derivatives, for example methyl cellulose, hydroxyethylcellulose, carboxymethyl-cellulose, starch and starch derivatives, for example cyanoalkyl ether starch, hydroxyalkyl ether starch and carboxymethyl-starch, proteins and protein degradation products, for example gelatin and gelatin derivatives, etc. An exhaustive description of protective colloids is given in Houben-Weyl [op. cit.] pp. 411–420.

Further suitable additives of the polymer dispersions Pd are components c), d) and e), described below, of the novel coating compositions, which when an aqueous polymer dispersion Pd is employed may have been added already to this dispersion in the amounts indicated.

Dispersing auxiliaries and/or additives can be added individually or as a mixture to the organic phase, to the aqueous phase or to the mixture of organic and aqueous phase.

If, to prepare the dispersions Pd, the polymer P is employed in an organic solvent, then this solvent can be removed by distillation after mixing with the aqueous phase and, if they are used, with the above-described additives. The distillation can take place under atmospheric or reduced pressure. In this case, depending on the organic solvent employed, some of the water may be removed as well in the form of an azeotropic mixture. In this case it may be necessary following distillation to add water in order to attain the desired solids content of the dispersion. The organic solvent is removed substantially to completion, with the residual solvent content generally being below 0.1% by weight based on the overall amount of the aqueous coating composition.

Component b):

The novel aqueous, radiation-curable coating compositions comprise as component b) from 0.1 to 90% by weight, preferably from 10 to 85% by weight, of at least one radiation-curable compound S which is soluble or dilutable in water, is different from P and comprises at least one $\alpha,\beta$-ethylenically unsaturated, radiation-curable double bond.

Suitable compounds S are aliphatic and aromatic epoxy acrylates and epoxy methacrylates, aliphatic compounds preferably being employed. These include, for example, the reaction products of acrylic acid or methacrylic acid with aliphatic glycidyl ethers, which reaction products have already been described as polymers P. Preferred glycidyl ethers employed are butanediol diglycidyl ether, pentanediol diglycidyl ether, hexanediol diglycidyl ether, phenyl glycidyl ether, etc., which are obtainable as Grilonit® RV grades from Ems.

Further suitable compounds S are polyether acrylates and methacrylates, polyester acrylates and methacrylates and polyurethane acrylates and methacrylates. Suitable compounds of this type are the corresponding polymers P described as component a). Among these, preference is given to the reaction products of acrylic or methacrylic acid with the polyesterols and polyetherols which were described as polycondensates Pk. Particular preference is given to the radiation curable acrylates described in EP-A-126 341 and EP-A-279 303, which are hereby incorporated in their entirety. Polyetherols employed in this context are preferably alkoxylated, especially ethoxylated and/or propoxylated, mono-, di-, tri- or polyfunctional alcohols.

Other suitable compounds S are melamine acrylates and methacrylates. These are obtained, for example, by esterifying the free methylol groups of the resins with acrylic acid or methacrylic acid, or by transetherification of etherified melamine compounds with hydroxyalkyl methacrylates, for example hydroxyethyl, hydroxypropyl and hydroxybutyl (meth)acrylate.

Still further suitable compounds S are, in general, thickeners which contain unsaturated groups. These include on the one hand polyurethane thickeners, which contain $\alpha,\beta$-ethylenically unsaturated double bonds as a result of the incorporation of the abovementioned hydroxyalkyl (meth) acrylates. They also include polyacrylate thickeners, which are obtained by polymer-analogous reaction of, for example, hydroxyl-containing polymers, or polymers containing acid groups, with epoxide-containing (meth)acrylates, for example glycidyl (meth)acrylate, or of hydroxyl-containing polymers by esterification with (meth)acrylic acid or reaction with (meth)acrylic anhydride, or by reaction with NCO-terminated (meth)acrylates, for example methacryloyl isocyanate, isocyanatoethyl (meth)acrylate, etc. They additionally include polyvinyl alcohols which are modified, for example, by reaction with (meth)acrylic anhydride or by esterification with (meth)acrylic acid with groups containing double bonds. Finally, they include copolymers comprising maleic anhydride as comonomer, the polymer being modified by ring opening of the anhydride with the abovementioned hydroxyalkyl (meth)acrylates or with hydroxy vinyl ethers, for example butanediol monovinyl ether, cyclohexanedimethanol monovinyl ether etc., with double bonds.

The compounds S are added to the novel aqueous, radiation-curable coating compositions in an amount such that these compositions attain a solids content in the range from 50 to 95% by weight.

In one preferred embodiment the coating compositions involved are those where:

I) the polymer P is an ester of $\alpha,\beta$-ethylenically unsaturated monocarboxylic acids with hydroxyl-containing polycondensates Pk and the compound S is an epoxy acrylate, epoxy methacrylate, polyether acrylate or polyether methacrylate, or II) the polymer P is a polyurethane derivative which contains $\alpha,\beta$-ethylenic double bonds, and the compound S is a polyurethane thickener with $\alpha,\beta$-ethylenically unsaturated, radiation-polymerizable double bonds, or III) the polymer P is a polyurethane derivative containing $\alpha,\beta$-ethylenic double bonds, and the compound S is an acrylate-based thickener with $\alpha,\beta$-ethylenically unsaturated, radiation-polymerizable double bonds, or IV) the polymer P is an ester of $\alpha,\beta$-ethylenically unsaturated monocarboxylic acids with hydroxyl-containing polycondensates Pk and the compound S is a melamine acrylate or melamine methacrylate.

Component c):

For radiation curing, the novel coating compositions can be subjected to high-energy electron beams or UV radiation. If cured by UV radiation, then the coating compositions have added to them as component c) from 0.05 to 20% by weight, preferably from 0.05 to 10% by weight and, in particular, from 0.1 to 5% by weight of a photoinitiator.

Suitable photoinitiators are described in P.K.T. Oldring, Chemistry & Technology of UV & EB Formulation for Coatings, Inks & Paints, SITA Technology, London 1991, Volume 3, Photoinitiators for Free Radical and Cationic Polymerization.

Examples include benzophenone, alkylbenzophenones, such as 4-methylbenzophenone, halomethylated benzophenones, Michler's ketone (4,4'-bisdimethylaminobenzophenone), halogenated benzophenones, such as 4-chlorobenzophenone, 4,4'-dichloro-benzophenone, anthraquinone, anthrone (9,10-dihydro-9-anthracenone), benzoin, isobutyl benzoin ether, benzil and benzil derivatives, such as benzil dimethyl ketal, and phosphine oxides or phosphine sulfides, such as bisacylphosphine oxides, 2,4,6-trimethylbenzoyldiphenylphosphine oxide, etc.

If desired the novel coating compositions may additionally comprise a synergist, preferably a tertiary amine. Examples of suitable synergists are triethylamine, dimethylethanolamine, methyldiethanolamine, triethanolamine, amino acrylates, for example amine-modified polyether acrylates, such as the BASF Laromer® grades LR 8956, LR 8889, LR 8869, LR 8894, PO 83F and PO 84F, and mixtures thereof. In the case of pure tertiary amines they are generally employed in an amount of up to 5% by weight, in the case of amino acrylates in an equivalent amount corresponding to the number of amino groups present, based on the overall amount of the coating compositions.

Component d):

The coating compositions may additionally comprise from about 0 to 60% by weight, preferably from about 5 to 50% by weight, of a filler. Examples of suitable fillers are silicates obtainable by hydrolyzing silicon tetrachloride (Aerosil® from Degussa), siliceous earth, talc, aluminum silicates, magnesium silicates, etc.

Component e):

The coating compositions may additionally include from 0 to 20% by weight of further additives. Suitable further additives are the protective colloids and emulsifiers already specified in connection with the aqueous polymer dispersions Pd of component a).

Further additives which can be present in the coating compositions are customary additives known to the skilled worker, for example matting agents, pigments, leveling assistants, antifoams, etc. They can be incorporated into the finished dispersions using customary methods.

The novel coating compositions advantageously have a solids content of at least 50% by weight, preferably at least 65% by weight, in particular at least 70% by weight and, with particular preference, at least 75% by weight. In general the coating compositions have a solids content of not more than 95% by weight.

Following application to the substrate, the radiation-curable coating compositions known from the prior art must generally be dried physically prior to irradiation with UV or electron beams. For this purpose the coating compositions are generally preheated at up to 100° C. for up to 30 minutes and then exposed for a short time to UV or high-energy electron beams. In the case of the novel coating compositions it is advantageous that physical drying can be omitted, depending on the application weight and from a solids content of about 65% by weight, preferably from a solids content of about 75% by weight, in the case of absorbent substrates. Then, following their application to the substrate, the coating compositions can be partially gelled by irradiation, or fully cured by irradiation if desired, and then coated with a customary radiation-curable coating system and cured. If desired, alternatively, they can be overcoated directly without partial gelling and curing. The coating compositions can in this case be applied by customary methods, for example spraying, curtain coating or rolling, to the surface.

The novel aqueous, radiation-curable coating compositions are prepared by dispersing the abovementioned individual components by customary methods. This can be done by mixing the components a), b), c), d) and e) individually or as mixtures and in solid or dissolved form or predispersed in an appropriate amount of water, and dispersing the mixture with stirring, for example. If an aqueous polymer dispersion Pd is employed, then individual components or two or more components of this dispersion may also be added and subsequently, if desired, the mixture may be diluted with water to the required solids content. Suitable processes and apparatus for preparing the novel coating compositions are known to the skilled worker.

The present dispersions are essentially free from organic solvents and have a long shelf life. They are highly suitable as coating compositions for all customary radiation-curable coatings, such as for those based on both aqueous and nonaqueous dispersions. They can be used to coat nonabsorbent substrates such as plastics, synthetic textile fibers, glass and, preferably, metals. The novel coating compositions are preferably suitable for coating absorbent substrates, for example paper, leather, textile, wood and wood-derived materials, such as chipboard. An advantage is that coatings of good adhesion are obtained even on various tropical woods, such as teak, mahogany, etc., on which coatings without a primer, and even customary coating compositions, show poor adhesion.

The invention is illustrated in more detail by means of the following, nonlimiting examples.

EXAMPLES

Example 1

67 parts of an aliphatic epoxy acrylate (Laromer® LR 8765 from BASF AG) are dispersed in 33 parts of a 50% polyester acrylate emulsion (Laromer® LR 8895 from BASF AG), and 1% of a 1:1 w/w photoinitiator mixture of benzophenone and 1-hydroxycyclohexyl phenyl ketone (Irgacure® 500, photoinitiator from Ciba) is added, giving a stable solution with a solids content of about 83%. This coating composition is applied as a primer by roller to a beech surface in a coat thickness of about 10 g/m² and is partially gelled with a radiation source (120 W/cm). Then a customary radiation-curable primer based on an amine-modified polyether acrylate and on another polyether acrylate is applied using a roller, partially gelled and cured to completion. After the surface has been sanded, a customary commercial UV-curable topcoat is applied and final curing is carried out. Adhesion properties of the coating surface are shown in Table 1.

Example 2

19 parts of a polyether acrylate (Laromer® LR 8967 from BASF AG) are dispersed in 80 parts of a 50% polyester acrylate emulsion (Laromer® LR 8895 from BASF AG), and 1% of a 1:1 w/w photoinitiator mixture of benzophenone and 1-hydroxycyclohexyl phenyl ketone (Irgacure® 500, from Ciba) is added, giving a stable emulsion with a solids content of 60%. This coating composition is applied by roller to a beech surface in a coat thickness of about 5–8 g/m² and is partially gelled with a radiation source (120 W/cm). Subsequently a standard system consisting of basecoat and topcoat is applied as in Example 1.

Example 3

40 parts of a 50% emulsion of a polyester acrylate (Laromer® PE 55 W from BASF AG) are mixed homogeneously with 60 parts of a melamine acrylate (Laromer® LR 8794 from BASF AG), 2% of 4-(2-hydroxyethoxy)phenyl 2-hydroxy-2-methylpropyl ketone (Irgacure® 2959, photoinitiator from Ciba) are added, and the composition is applied by roller to a beech surface in a coat thickness of 10 g/m² and is partially gelled using a radiation source (120 W/cm from IST). Subsequently a standard system consisting of basecoat and topcoat is applied as in Example 1.

Comparison:

A paint system as used in Examples 1 to 3 is applied to a beech wood surface which has not been treated with a primer beforehand.

The radiation-cured surfaces are assessed using the crosshatch value in accordance with ISO 2409, DIN 53151. The results are given in Table 1.

TABLE 1

| Example No. | | | |
| --- | --- | --- | --- |
| 1 | 2 | 3 | Comparison |
| 0–1 | 0–1 | 0–1 | 4 |

As demonstrated by the results in Table 1, the surfaces treated with a radiation-curable primer according to the invention exhibit markedly better crosshatch values than surfaces which have not been treated before applying the coating material.

We claim:

1. An aqueous, radiation-curable coating composition comprising:
    a) from 5.0 to 90.0% by weight of at least one water-dispersible polymer P comprising at least one $\alpha,\beta$-ethylenically unsaturated, radiation-polymerizable double bond,
    b) from 0.1 to 90% by weight of at least one radiation-curable compound S which is different from P and which is soluble in water or is dilutable with at least 10% by weight of water, based on the overall weight of the coating composition, and which comprises at least one $\alpha,\beta$-ethylenically unsaturated, radiation-polymerizable double bond,
    c) from 0 to 20% by weight of a photoinitiator,
    d) from 0 to 60% by weight of a filler,
    e) from 0 to 20% by weight of further additives, and
    f) water to 100% by weight.

2. A coating composition as claimed in claim 1 where the polymer P is selected from esters of $\alpha,\beta$-ethylenically unsaturated monocarboxylic acids with hydroxyl-containing polycondensates Pk, esters of $\alpha,\beta$-ethylenically unsaturated dicarboxylic monoesters with polycondensates Pk, ethers of $\alpha,\beta$-ethylenically unsaturated alcohols with polycondensates Pk, epoxy resin derivatives containing $\alpha,\beta$-ethylenic double bonds, polyurethane derivatives containing $\alpha,\beta$-ethylenic double bonds, and polymers with repeating units which comprise acyl residues having $\alpha,\beta$-ethylenic double bonds, and mixtures thereof.

3. A coating composition as claimed in claim 2, where the polycondensate Pk is selected from polyesters with or without ether groups, polyethers with or without ester groups, alkoxylates of dihydric or polyhydric alcohols, polyalkylene glycols, polyaddition polymers of cyclic ethers, and mixtures and copolymers thereof.

4. A coating composition as claimed in claim 1, where the compound S is dilutable with at least 15% by weight, of water, based on the overall weight of the coating composition.

5. A coating composition as claimed in claim 1, where the compound S is selected from epoxy acrylates, epoxy methacrylates, polyether acrylates, polyether methacrylates, polyester acrylates, polyester methacrylates, polyurethane acrylates, polyurethane methacrylates, melamine acrylates, melamine methacrylates, thickeners, and mixtures thereof.

6. A coating composition as claimed in claim 1, where
    I) the polymer P is an ester of $\alpha,\beta$-ethylenically unsaturated monocarboxylic acids with hydroxyl-containing polycondensates Pk and the compound S is an epoxy acrylate, epoxy methacrylate, polyether acrylate or polyether methacrylate, or
    II) the polymer P is a polyurethane derivative which contains $\alpha,\beta$-ethylenic double bonds, and the compound S is a polyurethane thickener with α,β-ethylenically unsaturated, radiation-polymerizable double bonds, or III) the polymer P is a polyurethane derivative containing α,β-ethylenic double bonds, and the compound S is an acrylate-based thickener with α,β-ethylenically unsaturated, radiation-polymerizable double bonds, or IV) the polymer P is an ester of α,β-ethylenically unsaturated monocarboxylic acids with hydroxyl-containing polycondensates Pk and the compound S is a melamine acrylate or melamine methacrylate.

7. A coating composition as claimed in claim 1, comprising as component c) from 0.05 to 20% by weight, preferably from 0.05 to 10% by weight and, in particular, from 0.1 to 5% by weight of a photoinitiator.

8. A coating composition as claimed in claim 1, where the photoinitiator is selected from benzophenone and derivatives thereof, benzoin and derivatives thereof, benzil and derivatives thereof, anthraquinone and derivatives thereof, anthrone and derivatives thereof, phosphine oxides and derivatives thereof, phosphine sulfides and derivatives thereof, and mixtures of these.

9. A coating composition as claimed in claim 1, wherein the photoinitiator additionally comprises a synergist.

10. A coating composition as claimed in claim 9 where the synergist is selected from triethylamine, dimethylethanolamine, methyldiethanolamine, triethanolamine, amino acrylates, and mixtures thereof.

11. A coating composition as claimed in claim 1, where the solids content is at least 50% by weight.

12. A process for preparing coated surfaces, which comprises i) applying a coating composition as claimed in claim 1 to the surface, ii) curing the applied coating composition by irradiation with UV radiation or electron beams, iii) applying at least one further radiation-curable coating material to the coated surface, and carrying out curing.

13. A process as claimed in claim 12, wherein the coating composition, following application to the surface in step i), is not additionally dried prior to irradiation.

14. The process as claimed in claim 12, wherein the coating composition is used as a primer, especially beneath radiation-curable coating materials.

15. The process as claimed in claim 14, wherein the coating composition is used as a primer for nonabsorbent surfaces, preferably metals, plastics and synthetic textile fibers.

16. The process as claimed in claim 14, wherein the coating composition is used as a primer for absorbent substrates, preferably wood, wood-derived materials, paper, cotton and leather.

17. The coating composition as claimed in claim 10, wherein the synergist is an amine-modified polyether acrylate.

18. The coating composition as claimed in claim 1, wherein the solids content is at least 60% by weight.

19. The coating composition as claimed in claim 1, wherein the solids content is at least 70% by weight.

20. The coating composition as claimed in claim 1, wherein the compound S is dilutable with at least 20% by weight of water, based on the overall weight of the coating composition.

* * * * *